US012593507B2

(12) United States Patent
Wang

(10) Patent No.: US 12,593,507 B2
(45) Date of Patent: Mar. 31, 2026

(54) SUBSTRATE, MANUFACTURING METHOD THEREOF, AND SPLICED PANEL

(71) Applicant: TCL CHINA STAR OPTOELECTRONICS TECHNOLOGY CO., LTD., Shenzhen (CN)

(72) Inventor: Hu Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1137 days.

(21) Appl. No.: 17/620,713

(22) PCT Filed: Dec. 8, 2021

(86) PCT No.: PCT/CN2021/136462
§ 371 (c)(1),
(2) Date: Jun. 1, 2023

(87) PCT Pub. No.: WO2023/092657
PCT Pub. Date: Jun. 1, 2023

(65) Prior Publication Data
US 2024/0030238 A1 Jan. 25, 2024

(30) Foreign Application Priority Data
Nov. 29, 2021 (CN) .......................... 202111435482.X

(51) Int. Cl.
*H10D 86/60* (2025.01)
*H01L 25/16* (2023.01)
(Continued)

(52) U.S. Cl.
CPC ........... *H10D 86/60* (2025.01); *H01L 25/167* (2013.01); *H10D 86/021* (2025.01); *H10D 86/443* (2025.01)

(58) Field of Classification Search
None
See application file for complete search history.

(56) References Cited

U.S. PATENT DOCUMENTS

2020/0411630 A1 12/2020 Kim

FOREIGN PATENT DOCUMENTS

| CN | 110853531 A | 2/2020 |
| CN | 212161812 U | 12/2020 |
(Continued)

OTHER PUBLICATIONS

Machine-generated English translation of CN 110853531 (Year: 2020).*
(Continued)

*Primary Examiner* — Bo B Jang
(74) *Attorney, Agent, or Firm* — PV IP PC; Christopher S. Ruprecht; Wei Te Chung

(57) ABSTRACT

A substrate, a manufacturing method thereof, and a spliced panel are disclosed. A base includes a front surface, a lateral surface, and a back surface. A first conductive layer is disposed on the front surface. The first conductive layer includes a first wire. A protective layer is disposed on the first conductive layer. A conductive part is correspondingly disposed in a contact hole and is connected to the first wire. The conductive part is stacked with the first wire to form an overlapping surface. A second conductive layer is disposed on the lateral surface of the base. The second conductive layer includes a second wire. The second wire is connected to the overlapping surface.

20 Claims, 4 Drawing Sheets

(51) Int. Cl.
H10D 86/01 (2025.01)
H10D 86/40 (2025.01)

(56) References Cited

FOREIGN PATENT DOCUMENTS

| CN | 112305795 A | 2/2021 |
| CN | 112599535 A | 4/2021 |
| CN | 113437025 A | 9/2021 |

OTHER PUBLICATIONS

International Search Report in International application No. PCT/CN2021/136462,mailed on Aug. 26, 2022.

Written Opinion of the International Search Authority in International application No. PCT/CN2021/136462,mailed on Aug. 26, 2022.

Chinese Office Action issued in corresponding Chinese Patent Application No. 202111435482.X dated Feb. 27, 2025, pp. 1-7.

* cited by examiner

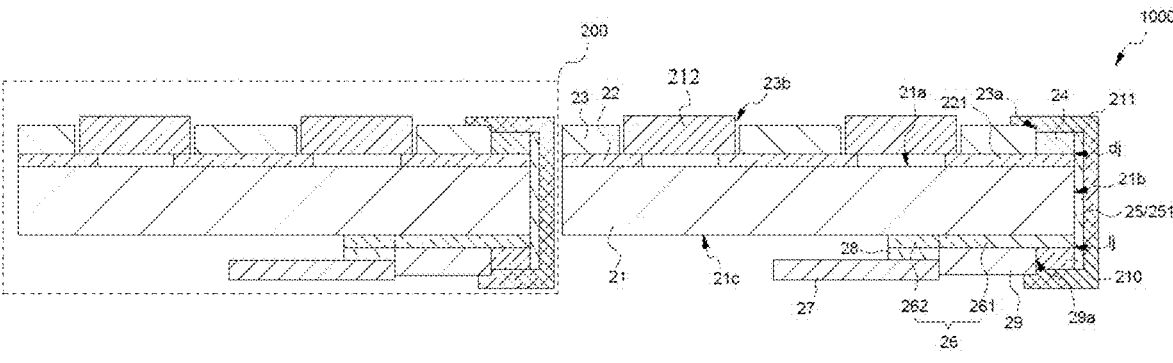

FIG. 3

| | |
|---|---|
| Providing a base, wherein the base includes a front surface, a lateral surface, and a back surface, the front surface is disposed opposite to the back surface, and the lateral surface is disposed between the front surface of the back surface. | B1 |
| Forming a first conductive layer on the front surface of the base, wherein the first conductive layer comprises a plurality of first wires, and the first wires are close to the lateral surface. | B2 |
| Forming a protective layer on the first conductive layer, wherein the protective layer is provided with a plurality of contact holes, the contact holes are close to the lateral surface, and each of the contact holes exposes part of the first wires. | B3 |
| Forming a conductive part on the first wires in the contact holes, wherein the conductive part is stacked with the first wires to form an overlapping surface, and the overlapping surface is close to the lateral surface. | B4 |
| Forming a second conductive layer on the lateral surface of the base and the overlapping surface, wherein the second conductive layer comprises a plurality of second wires, and the second wires are connected to the overlapping surface. | B5 |

FIG. 4

SUBSTRATE, MANUFACTURING METHOD THEREOF, AND SPLICED PANEL

FIELD

The present disclosure relates to the field of display technologies, and more specifically, to a substrate, a manufacturing method thereof, and a spliced panel.

BACKGROUND

During processes of researching and applying conventional technologies, the inventor of the present disclosure found that, in some display panels with narrow frames or without a frame, wires are arranged on a lateral surface. Main technologies of wire arrangement on lateral surface include a silver paste silk transfer method, a lateral deposition cooperated with photoresist stripping method, and a laser engraving method.

However, when silver paste silk or a photoresist are used to cover a lateral surface, the silver paste silk or the photoresist at corners between the lateral surface and a front surface would be peeled off. Therefore, a thin film would be thinner, reducing a yield rate.

Embodiments of the present disclosure provide a substrate, a manufacturing method thereof, and a spliced panel, which can improve a yield rate of wires on a lateral surface.

SUMMARY

An embodiment of the present disclosure provides a substrate, comprising:

a base, wherein the base comprises a front surface, a lateral surface, and a back surface, the front surface is disposed opposite to the back surface, and the lateral surface is disposed between the front surface and the back surface;

a first conductive layer, wherein the first conductive layer is disposed on the front surface and comprises a plurality of first wires, and the first wires are close to the lateral surface;

a protective layer, wherein the protective layer is disposed on the first conductive layer and is provided with a plurality of contact holes, the contact holes are close to the lateral surface, each of the contact holes exposes part of one of the first wires;

a plurality of conductive parts, wherein each of the conductive parts is correspondingly disposed in one of the contact holes and is connected to the first wires, the conductive parts are stacked with the first wires to form an overlapping surface, and the overlapping surface is close to the lateral surface; and a second conductive layer, wherein the second conductive layer is disposed on the lateral surface of the base, the second conductive layer comprises a plurality of second wires, and the second wires are connected to the overlapping surface.

Optionally, the second conductive layer comprises a conductive pad, the conductive pad is disposed on a side of the second wires away from the conductive part, and the conductive pad is connected to the second wires.

Optionally, in some embodiments of the present disclosure, the substrate comprises a third conductive layer, the third conductive layer is disposed on the back surface of the base, the third conductive layer comprises a third wire and a conductive pad connected to the third wire, and the third wire is connected to the second wires.

Optionally, in some embodiments of the present disclosure, the substrate comprises an insulating layer, the insulating layer is disposed on a surface of the third conductive layer away from the base, the insulating layer is provided with a through-hole, the through-hole is close to the lateral surface, and the through-hole exposes part of the third wire;

the substrate comprises a plurality of thickened parts, the thickened parts comprise a conductive material, one of the thickened parts is correspondingly disposed in the through-hole and is connected to the third wire, the thickened parts are stacked with the third wire to form a connecting surface, and the connecting surface is close to the lateral surface; and the second wires are connected to the connecting surface.

Optionally, in some embodiments of the present disclosure, the overlapping surface is aligned with the lateral surface.

Optionally, in some embodiments of the present disclosure, the substrate comprises a covering layer, and the covering layer covers the second wires and the conductive parts.

Optionally, in some embodiments of the present disclosure, the substrate comprises a light-emitting device, the protective layer is provided a plurality of pixel openings, and the light-emitting device is disposed in the pixel openings.

Correspondingly, an embodiment of the present disclosure further provides a spliced panel, comprising at least two substrates spliced to each other, wherein each of the at least two substrates comprises:

a base, wherein the base comprises a front surface, a lateral surface, and a back surface, the front surface is disposed opposite to the back surface, and the lateral surface is disposed between the front surface and the back surface;

a first conductive layer, wherein the first conductive layer is disposed on the front surface and comprises a plurality of first wires, and the first wires are close to the lateral surface;

a protective layer, wherein the protective layer is disposed on the first conductive layer and is provided with a plurality of contact holes, the contact holes are close to the lateral surface, each of the contact holes exposes part of one of the first wires;

a plurality of conductive parts, wherein each of the conductive parts is correspondingly disposed in one of the contact holes and is connected to the first wires, the conductive parts are stacked with the first wires to form an overlapping surface, and the overlapping surface is close to the lateral surface; and a second conductive layer, wherein the second conductive layer is disposed on the lateral surface of the base, the second conductive layer comprises a plurality of second wires, and the second wires are connected to the overlapping surface.

Optionally, in some embodiments of the present disclosure, the second conductive layer comprises a conductive pad, the conductive pad is disposed on a side of the second wires away from the conductive part, and the conductive pad is connected to the second wires.

Optionally, in some embodiments of the present disclosure, the substrate comprises a third conductive layer, the third conductive layer is disposed on the back surface of the base, the third conductive layer comprises a third wire and a conductive pad connected to the third wire, and the third wire is connected to the second wires.

Optionally, in some embodiments of the present disclosure, the substrate comprises an insulating layer, the insulating layer is disposed on a surface of the third conductive layer away from the base, the insulating layer is provided with a through-hole, the through-hole is close to the lateral surface, and the through-hole exposes part of the third wire;

the substrate comprises a plurality of thickened parts, the thickened parts comprise a conductive material, one of the thickened parts is correspondingly disposed in the through-hole and is connected to the third wire, the thickened parts are stacked with the third wire to form a connecting surface, and the connecting surface is close to the lateral surface; and the second wires are connected to the connecting surface.

Optionally, in some embodiments of the present disclosure, the overlapping surface is aligned with the lateral surface.

Optionally, in some embodiments of the present disclosure, the substrate comprises a covering layer, and the covering layer covers the second wires and the conductive parts.

Optionally, in some embodiments of the present disclosure, the substrate comprises a light-emitting device, the protective layer is provided a plurality of pixel openings, and the light-emitting device is disposed in the pixel openings.

Correspondingly, an embodiment of the present disclosure further provides a method of manufacturing a substrate, comprising following steps:

providing a base, wherein the base comprises a front surface, a lateral surface, and a back surface, the front surface is disposed opposite to the back surface, and the lateral surface is disposed between the front surface and the back surface;

forming a first conductive layer on the front surface of the base, wherein the first conductive layer comprises a plurality of first wires, and the first wires are close to the lateral surface;

forming a protective layer on the first conductive layer, wherein the protective layer is provided with a plurality of contact holes, the contact holes are close to the lateral surface, and each of the contact holes exposes part of the first wires;

forming a conductive part on the first wires in the contact holes, wherein the conductive part is stacked with the first wires to form an overlapping surface, and the overlapping surface is close to the lateral surface; and forming a second conductive layer on the lateral surface of the base and the overlapping surface, wherein the second conductive layer comprises a plurality of second wires, and the second wires are connected to the overlapping surface.

Optionally, in some embodiments of the present disclosure, the step of forming the protective layer on the first conductive layer, comprising following steps:

forming the protective layer on the first conductive layer; and defining the contact holes on an area of the protective layer corresponding to the first wires and on a reserved area of the base, wherein the reserved area of the base extends from an edge of the base to an end surface of the first wires, and the contact holes expose part of the first wires.

Optionally, in some embodiments of the present disclosure, the step of forming the conductive part on the first wires in the contact holes comprises following steps:

forming the conductive part on the first wires in the contact holes by electroplating or deposition; and removing the reserved area of the base to expose the overlapping surface formed from the conductive part stacked with the first wires.

Optionally, in some embodiments of the present disclosure, the conductive part is formed on the first wires in the contact holes by electroplating; and the reserved area of the base is removed by abrading to expose the overlapping surface formed from the conductive part stacked with the first wires, and the overlapping surface is aligned with the lateral surface.

Optionally, in some embodiments of the present disclosure, before the protective layer is formed on the first conductive layer, the conductive part is formed on the first wires in the contact holes, and the overlapping surface is formed from the conductive part stacked with the first wires; and wherein the method comprises following sequential processes:

forming a third conductive layer on the back surface of the base, wherein the third conductive layer comprises a third wire and a conductive pad connected to the third wire; and forming an insulating layer on a surface of the third conductive layer away from the base, wherein the insulating layer is provided with a through-hole, the through-hole is close to the lateral surface, the through-hole exposes part of the third wire, and the through-hole corresponds to the contact holes.

Optionally, in some embodiments of the present disclosure, the step of forming the conductive part on the first wires in the contact holes comprises following steps:

forming a thickened part in the through-hole by electroplating or deposition.

Regarding the beneficial effect: embodiments of the present disclosure provide a substrate. A base includes a front surface, a front surface, and a back surface. A first conductive layer is disposed on the front surface. The first conductive layer includes a plurality of first wires. A protective layer is disposed on the first conductive layer. The protective layer is provided with a plurality of contact holes. The contact holes are close to the lateral surface. Each of the contact holes exposes part of the first wires. A conductive part is correspondingly disposed in one of the contact holes and is connected to the first wires. The conductive part is stacked with the first wires to form an overlapping surface. The overlapping surface is close to the lateral surface. A second conductive layer is disposed on the lateral surface of the base. The second conductive layer includes a plurality of second wires. The second wires are connected to the overlapping surface.

Wherein, in the present disclosure, the conductive part is disposed on a side of the first wires close to the lateral surface of the base, thereby forming a bigger overlapping surface compared to the first wires. Then, the second wires disposed on the lateral surface are connected to the overlapping surface having a bigger surface. Therefore, a risk of wires at corners between the front surface and the lateral surface being thinned is reduced, and stability of connection between the wires is increased.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

FIG. 3 is a structural schematic view showing a spliced panel provided by an embodiment of the present disclosure.

FIG. 4 is a schematic flowchart showing a method of manufacturing a substrate provided by an embodiment of the present disclosure.

DETAILED DESCRIPTION

Figure 1:
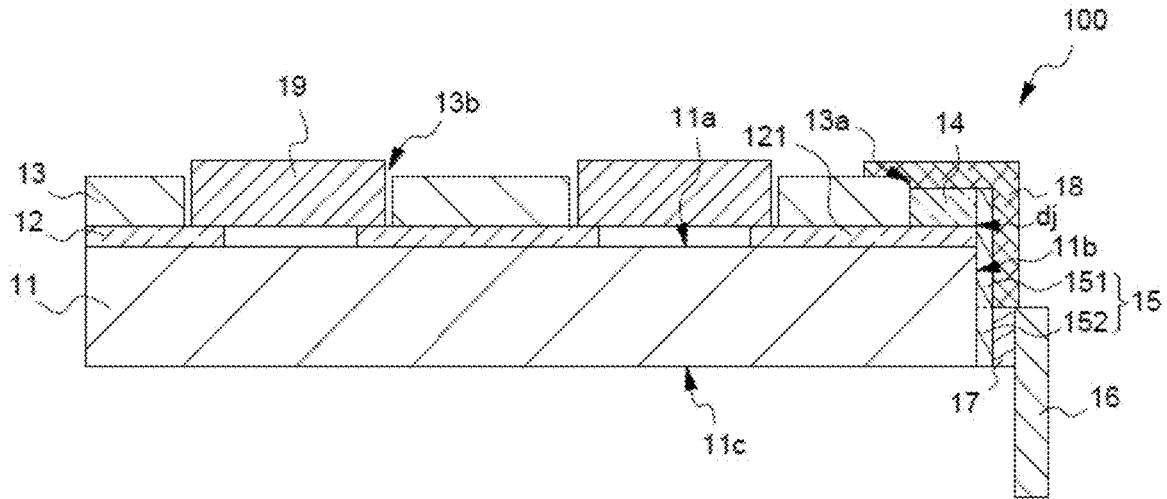
FIG. 1 is a structural schematic view showing a substrate provided by an embodiment of the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

Embodiments of the present disclosure provide a substrate, a manufacturing method thereof, and a spliced panel, which are described below in detail. It should be noted that the description order of embodiments does not mean preferred orders of the embodiments.

It should be noted that the substrate of the present disclosure may be one of a micro light-emitting diode (micro-LED) substrate, a mini-LED substrate, an organic light-emitting diode (OLED) substrate, a quantum-dot light-emitting diode (QLED), an array substrate, or a liquid crystal display (LCD) substrate.

Please refer to FIG. 1, an embodiment of the present disclosure provides a substrate 100, including a base 11, a first base layer 12, a protective layer 13, a plurality of conductive parts 14, and a second conductive layer 15.

The base 11 includes a front surface 11a, a lateral surface 11b, and a back surface 11c. The front surface 11a is disposed opposite to the back surface 11c. The lateral surface 11b is disposed between the front surface 11a and the back surface 11c.

The first conductive layer 12 is disposed on the front surface 11a. The first conductive layer 12 includes a plurality of first wires 121. The first wires 121 are close to the lateral surface 11b.

The protective layer 13 is disposed on the first conductive layer 12. The protective layer 13 is provided with a plurality of contact holes 13a. The contact holes 13a are close to the lateral surface 11b. Each of the contact holes 13a exposes part of one of the first wires 121.

A conductive part 14 is correspondingly disposed in one of the contact holes 13a and is connected to the first wires 121. The conductive part 14 is stacked with the first wire layer 121 to form an overlapping surface dj. The overlapping surface dj is close to the lateral surface 11b.

The second conductive layer 15 is disposed on the lateral surface 11b of the substrate 11. The second conductive layer 15 includes a plurality of second wires 151. The second wires 151 are connected to the overlapping surface dj.

In the embodiment of the present disclosure, the conductive part 14 is disposed on a side of the first wires 121 close to the lateral surface 11b of the substrate 100, thereby forming a bigger overlapping surface dj compared to the first wires 121. Then, the second wires 151 disposed on the lateral surface 11b are connected to the overlapping surface dj having a bigger surface. Therefore, a risk of wires at corners between the front surface 11a and the lateral surface 11b being thinned is reduced, and stability of connection between the wires is increased.

It should be noted that the base 11 may include a base plate and a (TFT) thin-film transistor structural layer disposed on the base plate.

The base plate may be a rigid base plate or a flexible base plate. A material of the base plate includes one of glass, sapphire, silicon, silica, polyethylene, polypropylene, polystyrene, polylactic acid, polyethylene dicarboxylate, polyethylene terephthalate, polyethylene naphthalate, polycarbonate, polyethersulfone, aromatic fluorotoluene including polyarylate, polycyclic olefin, polyimide, or polyurethane.

The TFT structural layer includes a gate, an active layer, a source/drain electrode, a first insulating layer disposed between the gate and the active layer, and a second insulating layer disposed between the active layer and the source/drain layer.

Wherein, the first conductive layer may be disposed on a same layer as the gate or the source/drain electrode, or may be disposed on a layer different from the gate and the source/drain electrode.

Optionally, the second conductive layer 15 further includes a conductive pad 152. The conductive pad 152 is disposed on a side of the second wires 151 away from the conductive part 14. The conductive pad 152 is connected to the second wires 151.

Optionally, the substrate 100 further includes a flexible circuit board (FCB) 16. The FCB 16 is binding connected to the conductive pad 151 by a conductive adhesive 17. That is, the substrate 100 provided by the embodiment of the present disclosure has a lateral binding structure.

Optionally, the overlapping surface dj is aligned with the lateral surface 11b, which is beneficial for overlappingly connecting the second wires 151 with the overlapping surface dj, thereby improving flatness.

In some embodiments, the overlapping surface dj may not be aligned with the lateral surface 11b. For example, a distance between the overlapping surface dj and the lateral surface 11b is less than or equal to 500 μm. The distance may be 500 μm, 450 μm, 400 μm, 300 μm, 200 μm, or 100 μm.

Optionally, the substrate 100 further includes a covering layer 18. The covering layer 18 covers the second wires 151 and the conductive pad 14. The covering layer 18 is configured to protect the second wires 151 and the conductive part 14.

Optionally, a thickness of the conductive part 14 is less than a depth of the contact holes 13a. The covering layer 18 covers an interior of the contact holes 13a, thereby increasing flatness of the substrate.

Optionally, the thickness of the conductive part 14 ranges from 6 μm to 10 μm. For example, the thickness of the conductive part 14 may be 6 μm, 7 μm, 8 μm, 9 μm, or 10 μm.

Optionally, a material of the covering layer 18 may be a black adhesive or other materials.

Optionally, the substrate 100 further includes a light-emitting device 19. The protective layer 13 is provided with a plurality of pixel openings 13b. The light-emitting device 19 is disposed in the pixel openings 13b.

Optionally, the light-emitting device 19 may be one of a micro-LED, a mini-LED, an OLED, a QLED. The light-emitting device 19 is electrically connected to the first wires 121.

In some embodiments, the substrate 100 may be an array substrate, including a pixel electrode. The first wires 121 may be electrically connected to a data line.

Figure 2:
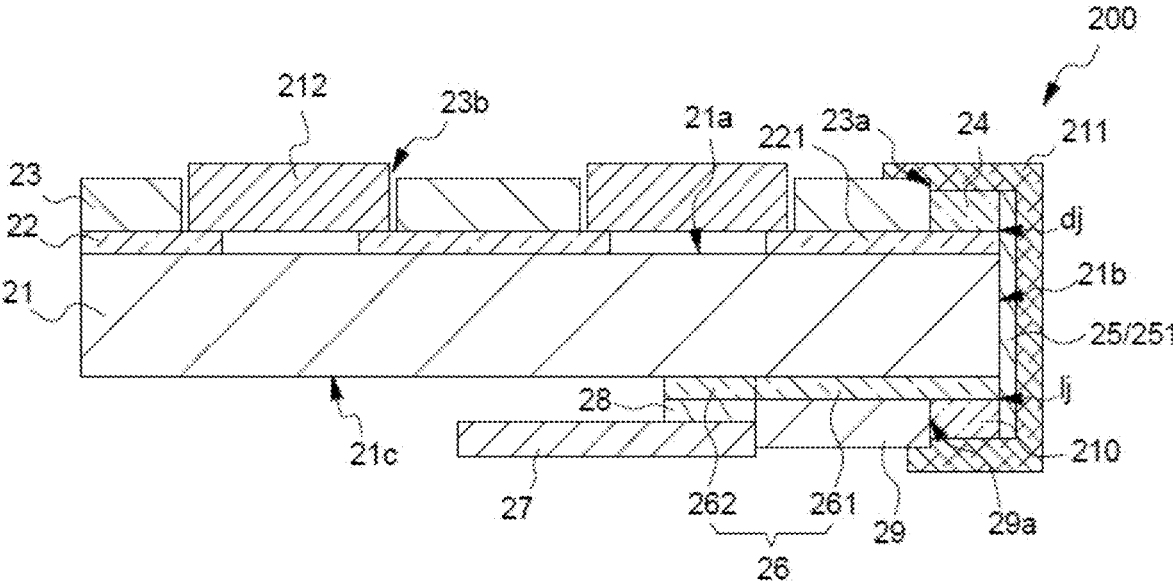
FIG. 2 is a structural schematic view showing another substrate provided by an embodiment of the present disclosure.

Please refer to FIG. 2, an embodiment of the present disclosure further relates to a substrate 200. The substrate 200 includes a base plate 21, a first conductive layer 22, a protective layer 23, a plurality of conductive parts 24, and a second conductive layer 25.

The base 21 includes a front surface 21a, a lateral surface 21b, and a back surface 21c. The front surface 21a is disposed opposite to the back surface 21c. The lateral surface 21b is disposed between the front surface 21a and the back surface 21c.

The first conductive layer 22 is disposed on the front surface 21a. The first conductive layer 22 includes a plurality of first wires 221. The first wires 221 are close to the lateral surface 21b.

The protective layer 23 is disposed on the first conductive layer 22. The protective layer 23 is provided with a plurality of contact holes 23a. The contact holes 23a are close to the lateral surface 21b. Each of the contact holes 23a exposes part of one of the first wires 221.

A conductive part 24 is correspondingly disposed in one of the contact holes 23a and is connected to the first wires 221. The conductive part 24 is stacked with the first wire layer 221 to form an overlapping surface dj. The overlapping surface dj is close to the lateral surface 21b.

The second conductive layer 25 is disposed on the lateral surface 21b of the substrate 21. The second conductive layer 25 includes a plurality of second wires 251. The second wires 251 are connected to the overlapping surface dj.

In the embodiment of the present disclosure, the conductive part 24 is disposed on a side of the first wires 221 close to the lateral surface 21b of the substrate 200, thereby forming a bigger overlapping surface dj compared to the first wires 221. Then, the second wires 251 disposed on the lateral surface 21b are connected to the overlapping surface dj having a bigger surface. Therefore, a risk of wires at corners between the front surface 21a and the lateral surface 21b being thinned is reduced, and stability of connection between the wires is increased.

Optionally, the overlapping surface dj is aligned with the lateral surface 21b, which is beneficial for overlappingly connecting the second wires 251 with the overlapping surface dj, thereby improving flatness.

In some embodiments, the overlapping surface dj may not be aligned with the lateral surface 21b. For example, a distance between the overlapping surface dj and the lateral surface 21b is less than or equal to 500 μm. The distance may be 500 μm, 450 μm, 400 μm, 300 μm, 200 μm, or 100 μm.

The difference between the substrate 200 of the present embodiment and the substrate 100 of the above embodiments is that the substrate 200 of the present embodiment has a back binding structure.

Specifically, the substrate 200 further includes a third conductive layer 26. The third conductive layer 26 is disposed on the back surface 11c of the base 11. The third conductive layer 26 includes a third wire 261 and a conductive pad 262 connected to the third wire 261. The third wire 261 is connected to the second wire 251.

The substrate 200 further includes an FCB 27. The FCB 27 is binding connected to the conductive pad 262 by a conductive adhesive 28. That is, the substrate 200 of the embodiment of the present disclosure has the back binding structure.

The substrate 200 of the present embodiment has the back binding structure. Compared with the substrate 100 of the above embodiment having the lateral binding structure, a width of a non-display area of the substrate 200 can be further reduced.

Optionally, the substrate 200 further includes an insulating layer 29. The insulating layer 29 is disposed on a surface of the third conductive layer 26 away from the base 21. The insulating layer 29 is provided with a through-hole 29a. The through-hole 29a is close to the lateral surface 21b. The through-hole 29a exposes part of the third wire 261.

The substrate 200 further includes a plurality of thickened parts 210. The thickened parts 210 are made of a conductive material. Each of the thickened parts 210 is correspondingly disposed in the through-hole 29a and is connected to the third wire 261. The thickened parts 210 are stacked with the third wire 261 to form a connecting surface Ij. The connecting surface Ij is close to the lateral surface 21b. The second wire 262 is connected to the connecting surface Ij.

In the embodiment of the present disclosure, the thickened parts 210 are disposed on a side of the third wire 261 close to the lateral surface 21b of the substrate 200, thereby forming a bigger connecting surface Ij compared to the third wire 261. Then, the second wires 251 disposed on the lateral surface 21b are connected to the connecting surface Ij having a bigger surface. Therefore, a risk of wires at corners between the back surface 21c and the lateral surface 21b being thinned is reduced, and stability of connection between the wires is increased.

Optionally, the connecting surface Ij is aligned with the lateral surface 21b, which is beneficial for overlappingly connecting the second wires 251 with the connecting surface Ij, thereby improving flatness.

In some embodiments, the connecting surface Ij may not be aligned with the lateral surface 21b. For example, a distance between the connecting surface Ij and the lateral surface 21b is less than or equal to 500 μm. The distance may be 500 μm, 450 μm, 400 μm, 300 μm, 200 μm, or 100 μm.

Optionally, the substrate 200 further includes a covering layer 211. The covering layer 211 covers the second wires 251, the conductive part 24, and the thickened parts 210, thereby protecting the second wires 251, the conductive part 24, and the thickened parts 210.

Optionally, a thickness of the conductive part 24 is less than a depth of the contact holes 23*a*. The covering layer 211 covers an interior of the contact holes 23, thereby improving flatness of the substrate.

Optionally, a thickness of the thickened part 210 is less than a depth of the through-hole 29*a*. The covering layer 211 covers an interior of the through-hole 29*a*, thereby improving flatness of the substrate.

Optionally, the thickness of the conductive part 24 and the thickness of the thickened part 210 range from 6 μm to 10 μm. For example, the thickness of the conductive part 24 and the thickness of the thickened part 210 may be 6 μm, 7 μm, 8 μm, 9 μm, or 10 μm.

Optionally, a material of the covering layer 211 may be a black adhesive or other materials.

Optionally, the substrate 200 further includes a light-emitting device 212. The protective layer 23 is provided with a plurality of pixel openings 23*b*. The light-emitting device 212 is disposed in the pixel openings 23*b*.

Optionally, the light-emitting device 212 may be one of a micro-LED, a mini-LED, an OLED, a QLED. The light-emitting device 212 is electrically connected to the first wires 221.

In some embodiments, the substrate 200 may be an array substrate, including a pixel electrode. The first wires 221 may be electrically connected to a data line.

Please refer to FIG. 3. Correspondingly, an embodiment of the present disclosure further relates to a spliced panel 1000, including at least two of any one of the substrate 100 or the substrate 200 spliced to each other.

In the present embodiment, two substrates 200 spliced to each other are taken as an example. However, the present embodiment is not limited thereto. In the spliced panel 1000 of the embodiment of the present disclosure, the conductive part 24 is disposed on a side of the first wires 221 close to the lateral surface 21*b* of the substrate 200, thereby forming a bigger overlapping surface dj compared to the first wires 221. Then, the second wires 251 disposed on the lateral surface 21*b* are connected to the overlapping surface dj having a bigger surface. Therefore, a risk of wires at corners between the front surface 21*a* and the lateral surface 21*b* being thinned is reduced, and stability of connection between the wires is increased.

In addition, in the embodiment of the present disclosure, the thickened parts 210 are disposed on a side of the third wire 261 close to the lateral surface 21*b* of the substrate 200, thereby forming a bigger connecting surface Ij compared to the third wire 261. Then, the second wires 251 disposed on the lateral surface 21*b* are connected to the connecting surface Ij having a bigger surface. Therefore, a risk of wires at corners between the back surface 21*c* and the lateral surface 21*b* being thinned is reduced, and stability of connection between the wires is increased.

Please refer to FIG. 4. Correspondingly, an embodiment of the present disclosure further designs a method of manufacturing a substrate, including following steps:

Step B1: providing a base, wherein the base includes a front surface, a lateral surface, and a back surface, the front surface is disposed opposite to the back surface, and the lateral surface is disposed between the front surface of the back surface;

Step B2: forming a first conductive layer on the front surface of the base, wherein the first conductive layer comprises a plurality of first wires, and the first wires are close to the lateral surface;

Step B3: forming a protective layer on the first conductive layer, the protective layer is provided with a plurality of contact holes, the contact holes are close to the lateral surface, and each of the contact holes exposes part of the first wires;

Step B4: forming a conductive part on the first wires in the contact holes, the conductive part is stacked with the first wires to form an overlapping surface, and the overlapping surface is close to the lateral surface; and Step B5: forming a second conductive layer on the lateral surface of the base and the overlapping surface, the second conductive layer comprises a plurality of second wires, and the second wires are connected to the overlapping surface.

In the embodiment of the present disclosure, the conductive part is disposed on a side of the first wires close to the lateral surface of the base, thereby forming a bigger overlapping surface compared to the first wires. Then, the second wires disposed on the lateral surface are connected to the overlapping surface having a bigger surface. Therefore, a risk of wires at corners between the front surface and the lateral surface being thinned is reduced, and stability of connection between the wires is increased.

The method of manufacturing the substrate of the embodiment of the present disclosure is described below.

The step B1: providing a base 11, wherein the base 11 includes a front surface 11*a*, a lateral surface 11*b*, and a back surface 11*c*. The front surface 11*a* is disposed opposite to the back surface 11*c*. The lateral surface 11*b* is disposed between the front surface 11*a* and the back surface 11*c*.

Optionally, the base 11 may include a base plate and a TFT structural layer disposed on the base plate.

The base plate may be a rigid base plate or a flexible base plate. A material of the base plate includes one of glass, sapphire, silicon, silica, polyethylene, polypropylene, polystyrene, polylactic acid, polyethylene dicarboxylate, polyethylene terephthalate, polyethylene naphthalate, polycarbonate, polyethersulfone, aromatic fluorotoluene including polyarylate, polycyclic olefin, polyimide, or polyurethane.

The TFT structural layer includes a gate, an active layer, a source/drain electrode, a first insulating layer disposed between the gate and the active layer, and a second insulating layer disposed between the active layer and the source/drain layer.

Wherein, the first conductive layer may be disposed on a same layer as the gate or the source/drain electrode, or may be disposed on a layer different from the gate and the source/drain electrode.

Then, proceed to the step B2.

Figure 5:
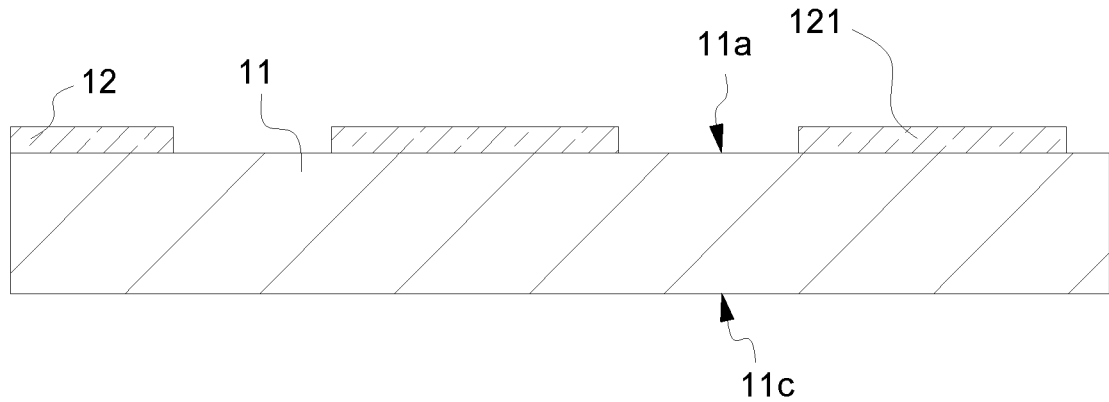
FIG. 5 is a schematic view showing a step B2 of the method of manufacturing the substrate provided by the embodiment of the present disclosure.

Please refer to FIG. 5. The step B2: forming a first conductive layer 12 on the front surface 11*a* of the base 11, wherein the first conductive layer 12 comprises a plurality of first wires 121, and the first wires 121 are close to the lateral surface 11*b*.

Optionally, a material of the first conductive layer 12 may include ITO or ITZO, or my include metal, an alloy, a compound, or a mixture including thereof. For example, the material may include Au, Ag, Cu, W, Mo, Fe, Al, aluminium silicon, aluminum titanium, molybdenum titanium, or metal nitrides.

Then, proceed to the step B3.

Figure 6:
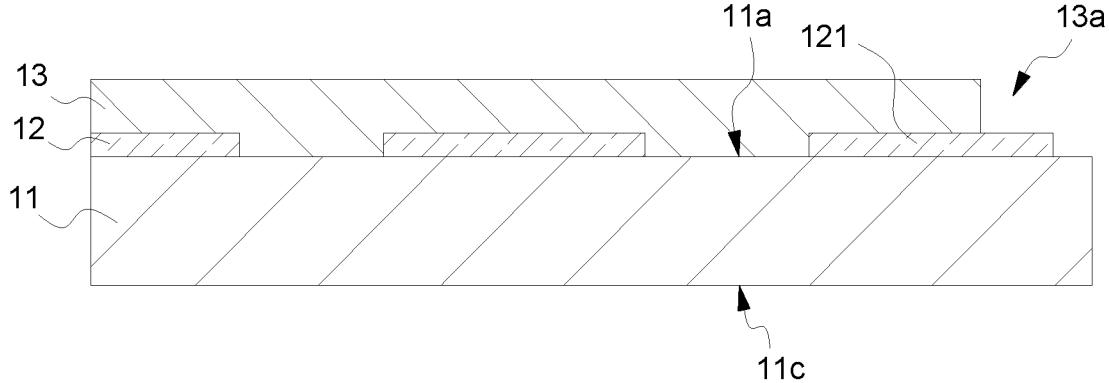
FIG. 6 is a schematic view showing a step B3 of the method of manufacturing the substrate provided by the embodiment of the present disclosure.

Please refer to FIG. 6. The step B3: forming a protective layer 13 on the first conductive layer 12, wherein the protective layer 13 is provided with a plurality of contact holes 13a, the contact holes 13a are close to the lateral surface 11b, and one of the contact holes 13a exposes part of the first wires 121.

Optionally, the step B3 includes following steps:

Step B31: forming the protective layer 13 on the first conductive layer 12.

Step B32: defining the contact holes 13a on an area of the protective layer 13 corresponding to the first wires 121 and on a reserved area of the base 11, the reserved area of the base 11 extends from an edge of the base 11 to an end surface of the first wires 121, and the contact holes 13a expose part of the first wires 121.

Optionally, a material of the protective layer 13 may include one of silicon nitride, silicon oxide, aluminum oxide, silicon oxynitride, or magnesium oxide.

Then, proceed to the step B4.

The step B4: forming a conductive part 14 on the first wires 121 in the contact holes 13a, wherein the conductive part 14 is stacked with the first wires 121 to form an overlapping surface dj, and the overlapping surface dj is close to the lateral surface 11b.

Figure 7:
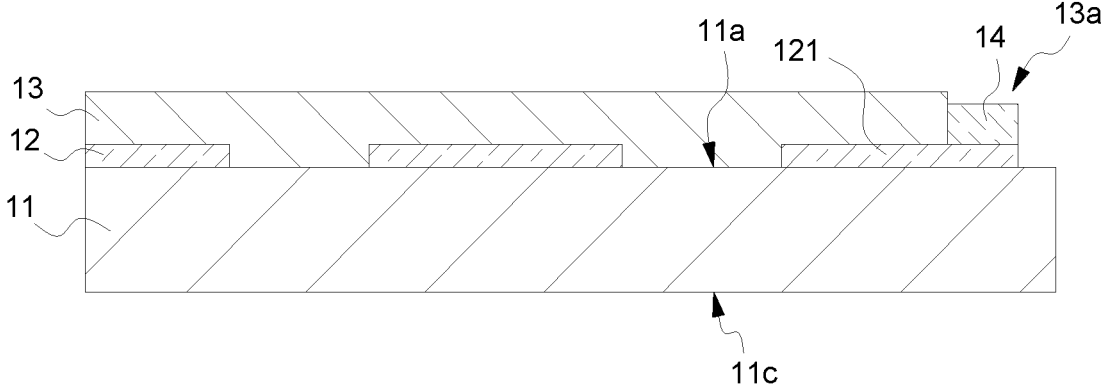
FIG. 7 is a schematic view showing a step B41 of the method of manufacturing the substrate provided by the embodiment of the present disclosure.

Optionally, the step B4 includes following steps:

Please refer to FIG. 7. Step B41: forming the conductive part 14 on the first wires 121 in the contact holes 13a by electroplating or deposition.

Optionally, in the present embodiment, the conductive part 14 is formed on the first wires 121 in the contact holes 13a by electroplating or deposition.

In the present embodiment, the conductive part 14 is formed on an exposed part of the first wires 121 by electroplating. Since the reserved area of the base 11 is not provided with metal as a cathode for electroplating, the conductive layer will not be formed in the reserved area. Therefore, difficulty of sequent abrading processes is reduced.

Optionally, a thickness of the conductive part 14 is less than a depth of the contact holes 13a. Therefore, a covering layer formed in sequent processes may cover an interior of the contact holes 13a, thereby improving flatness.

Optionally, the thickness of the conductive part 14 ranges from 6 μm to 10 μm. For example, the thickness of the conductive part 14 may be 6 μm, 7 μm, 8 μm, 9 μm, or 10 μm.

Figure 8:
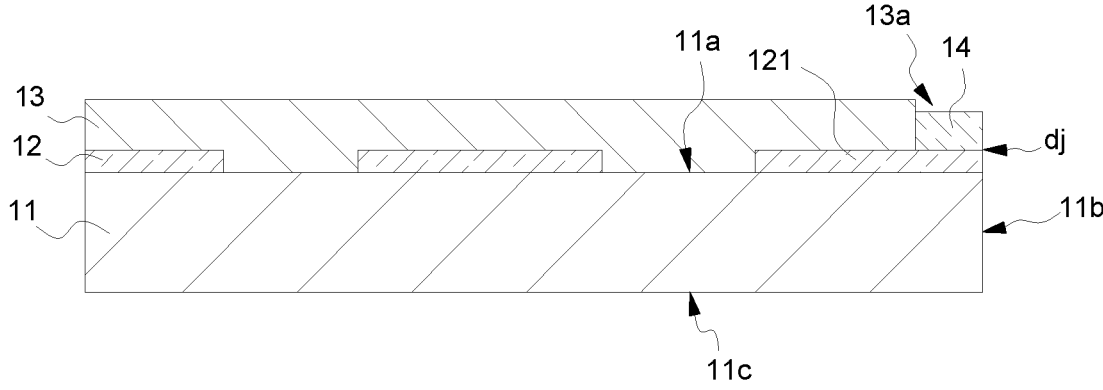
FIG. 8 is a schematic view showing a step B42 of the method of manufacturing the substrate provided by the embodiment of the present disclosure.

Please refer to FIG. 8. Step B42: removing the reserved area of the base 11 to expose the overlapping surface dj formed from the conductive part 14 stacked with the first wires 121.

Optionally, the reserved area of the base 11 is removed by abrading, thereby exposing the overlapping surface dj formed from the conductive part 14 stacked with the first wires, and the overlapping surface dj is aligned with the lateral surface 11b.

Compared to other removing methods, abrading can make the overlapping surface dj flatter. In addition, the base 11 is less damaged, and the overlapping surface dj may be aligned with the lateral surface 11b more precisely and more easily.

In some embodiments, the reserved area of the base 11 can be removed by laser or mechanical wheels.

Then, proceed to the step B5.

Figure 9:
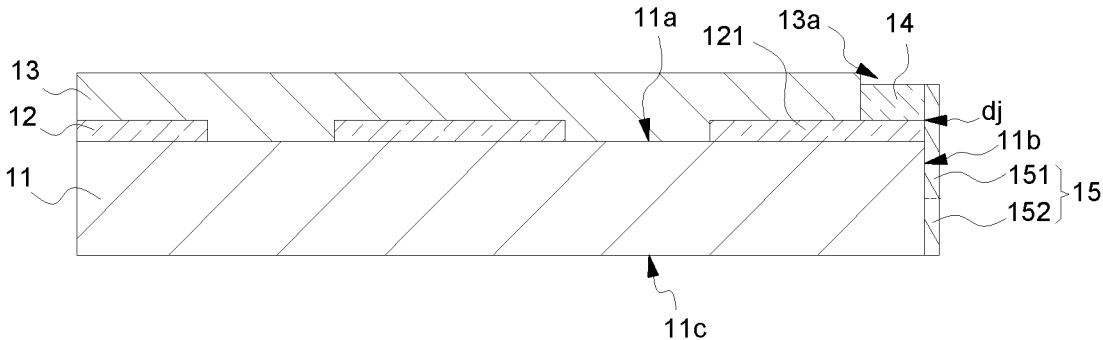
FIG. 9 is a schematic view showing a step B5 of the method of manufacturing the substrate provided by the embodiment of the present disclosure.

Please refer to FIG. 9. The step B5: forming a second conductive layer on the lateral surface 11b of the base 11 and the overlapping surface dj, the second conductive layer 15 comprises a plurality of second wires 15, and the second wires 15 are connected to the overlapping surface dj.

Optionally, first depositing a conductive material on the lateral surface 11b to form a conductive material layer, and then forming a plurality of second wires 151 by lithography or laser engraving.

In addition, the second wires 151 are connected to the overlapping surface dj. That is, the second wires 151 are connected to the first wires 121 and the conductive pad 14.

Figure 10:
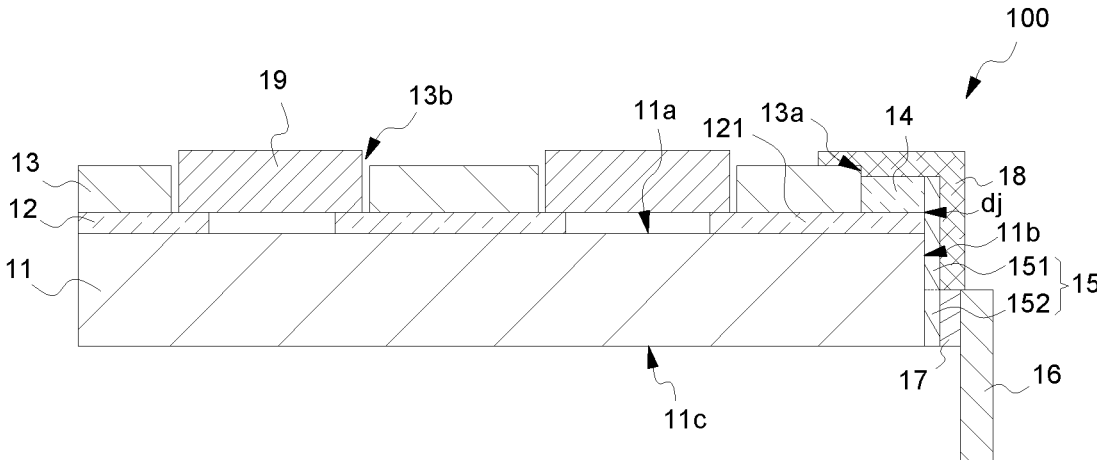
FIG. 10 is a schematic view showing a step B6 of the method of manufacturing the substrate provided by the embodiment of the present disclosure.

Wherein, when the substrate of the present embodiment is the substrate 100 of the above embodiments, please refer to FIG. 10, the method of manufacturing the substrate 100 further includes step B6: coating a covering layer 18 on the conductive part 14 and the second wires 151, binding connecting a flexible circuit board 16 with a conductive pad 151 of the second conductive layer 15 by a conductive adhesive 17, and disposing a light-emitting device 19 in a pixel opening 16b of the protective layer 13.

Finally, the method of manufacturing the substrate 100 of the present embodiment is finished.

When the substrate of the present embodiment is the substrate 200 of the above embodiment, the method of manufacturing the substrate 200 of the present embodiment after the step B3 and before the step B4 further includes:

Step B06, forming a third conductive layer on the back surface of the base, wherein the third conductive layer includes a third wire and a conductive pad connected to the third wire.

Step B07: forming an insulating layer on a surface of the third conductive layer away from the base. Wherein the insulating layer is provided with a through-hole. The through-hole is close to the lateral surface. The through-hole exposes part of the third wire. The through-hole corresponds to the contact hole.

Then, proceed to the step B4.

In the step B4, the conductive part 14 is formed in the contact hole 13a and a thickened part is formed in the through-hole. Optionally, the conductive layer 14 and the thickened part are simultaneously formed by electroplating, thereby simplifying manufacturing processes.

In some embodiments, the conductive part 14 and the thickened part may also be formed in different steps. For example, first forming the conductive part 14, and then forming the thickened part.

When the reserved area of the base 11 is removed, the overlapping surface dj and a connecting surface are formed. The connecting surface is formed from the thickened part stacked with the third wire.

Optionally, the connecting surface is aligned with the lateral surface 11b.

Then, proceed to the step B5.

In step B5, the second wires 151 are further connected to the connecting surface.

Then, proceed to step B08.

Step B08: coating a covering layer on the conductive part 14, the second wires 151, and the thickened part, and then binding connecting the flexible circuit board with the conductive pad of the third conductive layer by the conductive adhesive, thereby disposing the light-emitting device in the pixel opening 13b of the protective layer 13.

Finally, the method of manufacturing the substrate 20 of the present embodiment is finished.

Embodiments of the present disclosure provide a substrate. A base includes a front surface, a front surface, and a back surface. A first conductive layer is disposed on the front surface. The first conductive layer includes a plurality of first wires. A protective layer is disposed on the first conductive layer. The protective layer is provided with a plurality of contact holes. The contact holes are close to the lateral surface. Each of the contact holes exposes part of the first wires. A conductive part is correspondingly disposed in one of the contact holes and is connected to the first wires. The conductive part is stacked with the first wires to form an overlapping surface. The overlapping surface is close to the lateral surface. A second conductive layer is disposed on the lateral surface of the base. The second conductive layer includes a plurality of second wires. The second wires are connected to the overlapping surface.

Wherein, in the present disclosure, the conductive part is disposed on a side of the first wires close to the lateral surface of the base, thereby forming a bigger overlapping surface compared to the first wires. Then, the second wires disposed on the lateral surface are connected to the overlapping surface having a bigger surface. Therefore, a risk of wires at corners between the front surface and the lateral surface being thinned is reduced, and stability of connection between the wires is increased.

A substrate, a manufacturing method thereof, and a spliced panel have been described in detail by the above embodiments, which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A substrate, comprising:
a base, wherein the base comprises a front surface, a lateral surface, and a back surface, the front surface is disposed opposite to the back surface, and the lateral surface is disposed between the front surface and the back surface;
a first conductive layer, wherein the first conductive layer is disposed on the front surface and comprises a plurality of first wires, and the first wires are close to the lateral surface;
a protective layer, wherein the protective layer is disposed on the first conductive layer and is provided with a plurality of contact holes, the contact holes are close to the lateral surface, each of the contact holes exposes part of one of the first wires;
a plurality of conductive parts, wherein each of the conductive parts is correspondingly disposed in one of the contact holes and is connected to one of the first wires, the conductive parts are stacked with the first wires to form an overlapping surface, and the overlapping surface is close to the lateral surface;
a second conductive layer, wherein the second conductive layer is disposed on the lateral surface of the base, the second conductive layer comprises a plurality of second wires, and the second wires are connected to the overlapping surface;
a third conductive layer, wherein the third conductive layer is disposed on the back surface of the base, the third conductive layer comprises a plurality of third wires and a plurality of conductive pads connected to the third wires, and each of the third wires is connected to one of the second wires;
an insulating layer, wherein the insulating layer is disposed on a surface of the third conductive layer away from the base, the insulating layer is provided with a plurality of through-holes, the through-holes are close to the lateral surface, and each of the through-holes exposes part of one of the third wires; and
a plurality of thickened parts, wherein the thickened parts comprise a conductive material, each of the thickened parts is correspondingly disposed in one of the through-holes and is connected to one of the third wires, the thickened parts are stacked with the third wires to form a connecting surface, and the connecting surface is close to the lateral surface;
wherein the second wires are connected to the connecting surface.

2. The substrate of claim 1, wherein the second conductive layer comprises a plurality of conductive pads, the conductive pads are disposed on a side of the second wires away from the conductive parts, and each of the conductive pads is connected to one of the second wires.

3. The substrate of claim 1, wherein the overlapping surface is aligned with the lateral surface.

4. The substrate of claim 1, wherein the substrate comprises a covering layer, and the covering layer covers the second wires and the conductive parts.

5. The substrate of claim 4, wherein a material of the covering layer is a black adhesive.

6. The substrate of claim 1, wherein the substrate comprises a plurality of light-emitting devices, the protective layer is provided with a plurality of pixel openings, and each of the light-emitting devices is disposed in one of the pixel openings.

7. The substrate of claim 6, wherein each of the pixel openings exposes a part of the first conductive layer.

8. A spliced panel, comprising at least two substrates spliced to each other, wherein each of the at least two substrates comprises:
a base, wherein the base comprises a front surface, a lateral surface, and a back surface, the front surface is disposed opposite to the back surface, and the lateral surface is disposed between the front surface and the back surface;
a first conductive layer, wherein the first conductive layer is disposed on the front surface and comprises a plurality of first wires, and the first wires are close to the lateral surface;
a protective layer, wherein the protective layer is disposed on the first conductive layer and is provided with a plurality of contact holes, the contact holes are close to the lateral surface, each of the contact holes exposes part of one of the first wires;
a plurality of conductive parts, wherein each of the conductive parts is correspondingly disposed in one of the contact holes and is connected to one of the first wires, the conductive parts are stacked with the first wires to form an overlapping surface, and the overlapping surface is close to the lateral surface;
a second conductive layer, wherein the second conductive layer is disposed on the lateral surface of the base, the second conductive layer comprises a plurality of second wires, and the second wires are connected to the overlapping surface;
a third conductive layer, wherein the third conductive layer is disposed on the back surface of the base, the third conductive layer comprises a plurality of third wires and a plurality of conductive pads connected to the third wires, and each of the third wires is connected to one of the second wires;
an insulating layer, wherein the insulating layer is disposed on a surface of the third conductive layer away from the base, the insulating layer is provided with a plurality of through-holes, the through-holes are close to the lateral surface, and each of the through-holes exposes part one of the third wires; and a plurality of thickened parts, wherein the thickened parts comprise a conductive material, each of the thickened parts is correspondingly disposed in one of the through-holes and is connected to one of the third wires, the thickened parts are stacked with the third wires to form a connecting surface, and the connecting surface is close to the lateral surface;

wherein the second wires are connected to the connecting surface.

9. The spliced panel of claim 8, wherein the second conductive layer comprises a plurality of conductive pads, the conductive pads are disposed on a side of the second wires away from the conductive parts, and each of the conductive pads is connected to one of the second wires.

10. The spliced panel of claim 8, wherein the overlapping surface is aligned with the lateral surface.

11. The spliced panel of claim 8, wherein the substrate comprises a covering layer, and the covering layer covers the second wires and the conductive parts.

12. The spliced panel of claim 11, wherein a material of the covering layer is a black adhesive.

13. The spliced panel of claim 8, wherein the substrate comprises a plurality of light-emitting devices, the protective layer is provided with a plurality of pixel openings, and each of the light-emitting devices is disposed in one of the pixel openings.

14. The spliced panel of claim 13, wherein each of the pixel openings exposes a part of the first conductive layer.

15. A method of manufacturing a substrate, comprising following steps:

providing a base, wherein the base comprises a front surface, a lateral surface, and a back surface, the front surface is disposed opposite to the back surface, and the lateral surface is disposed between the front surface and the back surface;

forming a first conductive layer on the front surface of the base, wherein the first conductive layer comprises a plurality of first wires, and the first wires are close to the lateral surface;

forming a protective layer on the first conductive layer, wherein the protective layer is provided with a plurality of contact holes, the contact holes are close to the lateral surface, and each of the contact holes exposes part of one of the first wires;

forming a plurality of conductive parts on the first wires in the contact holes, wherein the conductive parts are stacked with the first wires to form an overlapping surface, and the overlapping surface is close to the lateral surface; and forming a second conductive layer on the lateral surface of the base and the overlapping surface, wherein the second conductive layer comprises a plurality of second wires, and the second wires are connected to the overlapping surface.

16. The method of claim 15, wherein the step of forming the protective layer on the first conductive layer comprises following steps:

forming a protective material layer on the first conductive layer; and defining the contact holes on an area of the protective material layer corresponding to the first wires and on a reserved area of the base, wherein the reserved area of the base extends from an edge of the base to an end surface of the first wires, and each of the contact holes exposes part of one of the first wires.

17. The method of claim 16, wherein the step of forming the conductive parts on the first wires in the contact holes comprises following steps:

forming the conductive parts on the first wires in the contact holes by electroplating or deposition; and removing the reserved area of the base to expose the overlapping surface formed from the conductive parts stacked with the first wires.

18. The method of claim 17, wherein the conductive parts are formed on the first wires in the contact holes by electroplating; and the reserved area of the base is removed by abrading to expose the overlapping surface formed from the conductive parts stacked with the first wires, and the overlapping surface is aligned with the lateral surface.

19. The method of claim 17, wherein after the protective layer is formed on the first conductive layer, and before the conductive parts are formed on the first wires in the contact holes so that the overlapping surface is formed from the conductive parts stacked with the first wires, the method further comprises following sequential processes:

forming a third conductive layer on the back surface of the base, wherein the third conductive layer comprises a plurality of third wires and a plurality of conductive pads connected to the third wires; and forming an insulating layer on a surface of the third conductive layer away from the base, wherein the insulating layer is provided with a plurality of through-holes, the through-holes are close to the lateral surface, each of the through-holes exposes part of one of the third wires, and each of the through-holes corresponds to one of the contact holes.

20. The method of claim 19, wherein the step of forming the conductive parts on the first wires in the contact holes comprises following steps:

forming a plurality of thickened parts in the through-holes by electroplating or deposition.

* * * * *